United States Patent
Tsividis

(10) Patent No.: US 7,298,310 B2
(45) Date of Patent: *Nov. 20, 2007

(54) CONTINUOUS-TIME DIGITAL SIGNAL GENERATION, TRANSMISSION, STORAGE AND PROCESSING

(75) Inventor: Yannis Tsividis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/244,795

(22) Filed: Oct. 6, 2005

(65) Prior Publication Data

US 2006/0028365 A1    Feb. 9, 2006

Related U.S. Application Data

(63) Continuation of application No. 10/878,155, filed on Jun. 28, 2004, now Pat. No. 7,132,972.

(60) Provisional application No. 60/483,344, filed on Jun. 27, 2003.

(51) Int. Cl.
    *H03M 1/36* (2006.01)
(52) U.S. Cl. .................... 341/159; 341/155; 341/158
(58) Field of Classification Search ......... 341/158–159
    See application file for complete search history.

(56) References Cited

U.S. PATENT DOCUMENTS

| | | | | | |
|---|---|---|---|---|---|
| 4,884,075 | A | * | 11/1989 | Mangelsdorf | 341/159 |
| 4,994,808 | A | * | 2/1991 | Wichelman | 341/161 |
| 6,198,421 | B1 | * | 3/2001 | Doyle et al. | 341/159 |
| 6,597,302 | B2 | * | 7/2003 | Nagaraj et al. | 341/155 |
| 6,677,569 | B2 | * | 1/2004 | Beusch | 250/208.1 |
| 7,132,972 | B2 | * | 11/2006 | Tsividis | 341/158 |

* cited by examiner

*Primary Examiner*—Khai M. Nguyen
(74) *Attorney, Agent, or Firm*—Wilmer Cutler Pickering Hale and Dorr LLP

(57) ABSTRACT

A method of digitally processing an analog signal in continuous time includes producing a continuous-time digital signal from an analog signal via a technique that does not include periodic sampling, then producing one or more delayed versions of the continuous-time digital signal. Each delayed version is delayed by nT, where n is an integer greater than zero, and T is a delay interval. The method further includes multiplying the continuous-time digital signal and each of the delayed versions by one or more associated coefficients, so as to produce a set of products, then adding the set of products, so as to produce a sum value corresponding to the analog signal processed by a transfer function defined by the associated coefficients. The individual bit paths of the continuous-time digital signal are multiplied by the coefficients, and the resulting products are combined by a binary-weighted adder.

5 Claims, 4 Drawing Sheets

CONTINUOUS-TIME DIGITAL SIGNAL GENERATION, TRANSMISSION, STORAGE AND PROCESSING

CROSS-REFERENCE TO RELATED APPLICATIONS

This application is a continuation of U.S. patent application Ser. No. 10/878,155, filed Jun. 28, 2004 now U.S. Pat. No. 7,132,972, which is hereby incorporated by reference in its entirety. This application also claims the benefit of U.S. Provisional Patent Application No. 60/483,344, filed Jun. 27, 2003.

TECHNICAL FIELD

This invention relates generally to continuous-time digital representation, generation transmission, storage and processing of continuous-time signals.

BACKGROUND

Conventional Digital Signal Processing (DSP) suffers from aliasing and produces quantization "noise" which includes numerous components non-harmonically related to the signal being processed. Techniques such as dithering and non-uniform sampling may reduce or modify one or both of these undesired effects, but residual aliasing and/or quantization noise typically remains even after applying such techniques.

SUMMARY OF THE INVENTION

Digitally processing an analog signal that has been quantized without sampling results in no aliasing and reduces in-band quantization error as compared to conventional digital processing techniques. The following description sets forth a continuous-time digital system that quantizes an analog signal without sampling and processes an input signal with substantially the same transfer function as a classical analog transmission line filter.

In one aspect, an apparatus for generating a continuous-time quantized and digitized signal from a continuous-time analog signal includes one or more comparators for comparing the continuous-time analog signal to a set of reference signals, and producing an intermediate signal that represents the reference signal to which the analog signal is nearest in amplitude. The apparatus also includes an encoder for producing a continuous-time digital word that represents the intermediate signal. The apparatus may include a recorder for recording the digital word on a continuous-time storage medium. The recorder may also record timing information related to when the digital word changes from one value to another value.

In another aspect, a method of generating a continuous-time quantized and digitized signal from a continuous-time analog signal includes comparing the continuous-time analog signal to a set of reference signals, and producing an intermediate signal that represents the reference signal to which the analog signal is nearest in amplitude. The method further includes producing a continuous-time digital word that represents the intermediate signal. The method may include recording the continuous-time digital word on a continuous-time storage medium, and the recorder may record timing information related to when the digital word changes from one value to another value.

In another aspect, a method of generating a continuous-time quantized and digitized signal from a continuous-time analog signal includes producing a sequence of discrete signals corresponding to the analog signal. Each discrete signal corresponds to the analog signal falling within one of a set of contiguous amplitude ranges. The method also includes producing a sequence of digital words. Each of the digital words represents a corresponding discrete signal from the sequence of discrete signals. The method may include recording the digital word on a continuous-time storage medium, and/or recording timing information related to when the digital word changes from one value to another value.

In another aspect, a continuous-time digital signal processor includes a quantizer for producing a continuous-time digital signal from an analog signal. The quantizer produces the continuous-time digital signal without periodic sampling. The continuous-time digital processor further includes a continuous-time delay line for producing one or more delayed versions of the continuous-time digital signal. Each delayed version is delayed by nT, where n is a number greater than zero, and T is a delay interval. The processor further includes multipliers for multiplying the continuous-time digital signal and each of the delayed versions by one or more associated coefficients representing a filtering function, so as to produce a set of products. The processor also includes an adder for adding the set of products, so as to produce a sum value corresponding to the analog signal processed by a transfer function defined by the associated coefficients. The quantizer may include a non-sampling ADC that compares the analog signal to a set of reference voltages. Each time the analog signal equals or exceeds a particular one of the reference voltages, the non-sampling ADC produces a digital word that represents the particular one of the reference voltages. The continuous-time digital signal is a sequence of digital binary words, each of which corresponds to an amplitude of the analog signal at an instant of time.

In one embodiment, the continuous-time delay line includes a cascade of logic devices. The cascade of logic devices may include logic inverters, some or all coupled to a load capacitance for slowing the logic inverter switching time.

In one embodiment, the continuous-time digital signal includes a sequence of digital words, and the multiplier multiplies each bit of each digital word by one or more transfer function coefficients. The multiplier includes one or more AND gating functions, wherein the multiplying includes gating each bit of each digital word with one or more transfer function coefficients.

In one embodiment, the continuous-time digital signal is stored on a memory medium, such as magnetic tape, for later processing and/or transmitting.

In another aspect, a method of digitally processing an analog signal in continuous time includes producing a continuous-time digital signal from an analog signal without periodic sampling. The method further includes producing one or more delayed versions of the continuous-time digital signal, each delayed version being delayed by nT, where n is a number greater than zero, and T is a delay interval. The method further includes multiplying the continuous-time digital signal and each of the delayed versions by one or more associated coefficients to produce a set of products, and adding the set of products to produce a sum value. This sum value corresponds to the analog signal processed by a transfer function defined by the associated coefficients.

In one embodiment, the method further includes producing a continuous-time digital signal from an analog signal by comparing the analog signal to a set of reference voltages, and producing a digital word that represents the particular one of the reference voltages each time the analog signal equals or exceeds a particular one of the reference voltages.

In one embodiment, the method further includes multiplying the continuous-time digital signal and each of the delayed versions by one or more associated coefficients representing a filtering function. The method may further include multiplying individual bits of the continuous-time digital signal by one or more transfer function coefficients.

In one embodiment, the method further includes storing the continuous-time digital signal on a memory medium, for example on magnetic tape, for later processing.

DETAILED DESCRIPTION

The described embodiment quantizes and digitizes an input analog signal without sampling, so as to produce a continuous-time digital signal. This continuous-time digital signal is a function of continuous time, such that a set of pairs, e.g., $(t_i, x_i)$ completely describes the continuous-time digital signal (where $x_i$ represents the amplitude value, and $t_i$ represents the time at which that amplitude value was reached). Since the amplitude levels are known, a type of delta modulation signal may also be used. In some embodiments, the quantized and digitized information related to the input analog signal is stored in a memory medium (such as magnetic tape or some other continuous-time storage medium) and may be later transmitted, and/or processed as described herein.

Note that in addition to quantizing and digitizing the amplitude information related to the input analog signal, the timing information related to when quantized and digitized amplitude information changes states can also be stored on storage media, along with the associated amplitude information. Note also that this stored information does not need to be processed as described herein; the generation, storage and/or transmission of the quantized and digitized continuous-time signal has utility in and of itself.

Figure 1:
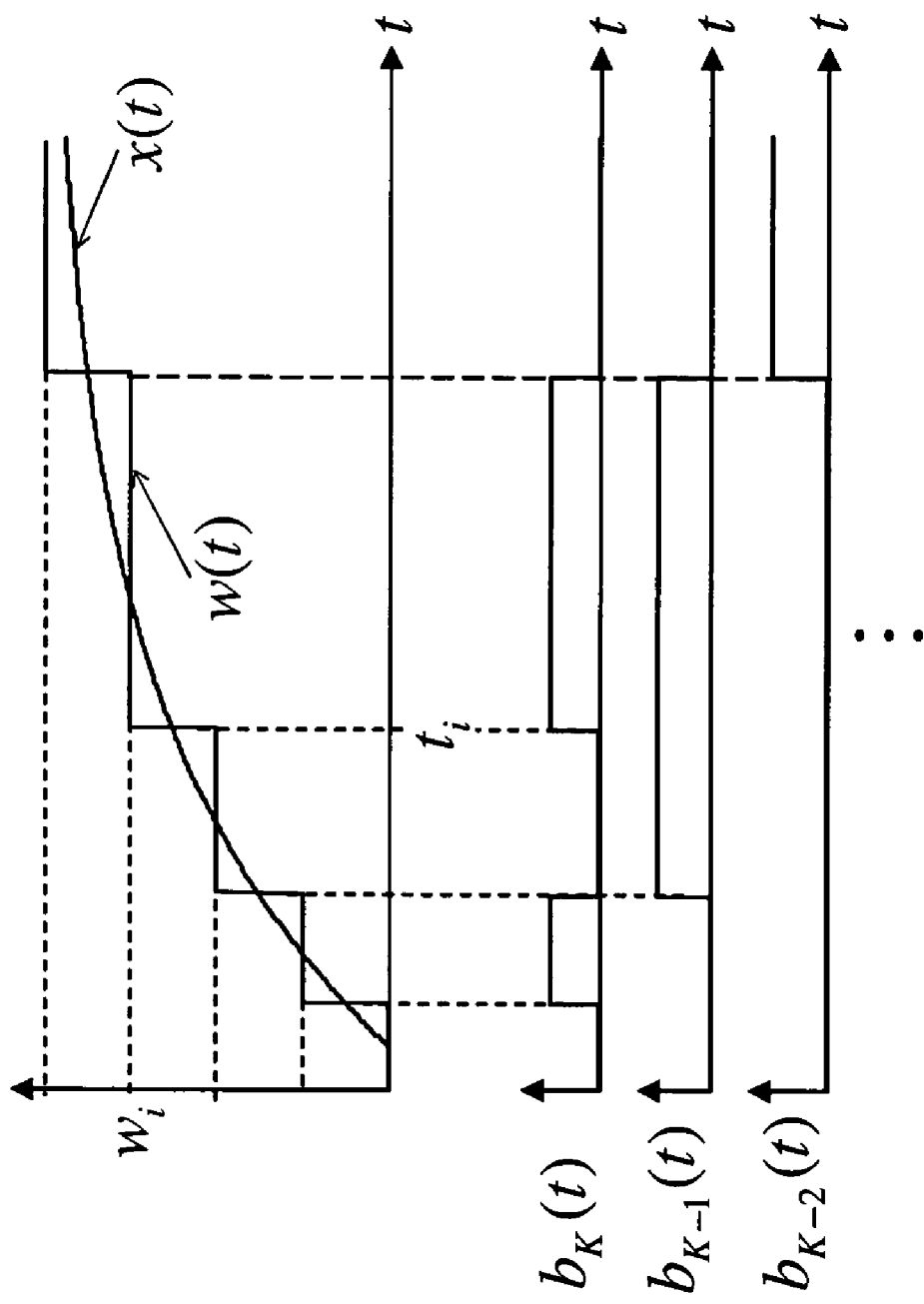
FIG. 1 shows one way of representing an input analog signal with a quantized and digitized continuous-time signal.

FIG. 1 shows one way of representing an input analog signal x(t) with a quantized continuous-time signal w(t). In this embodiment, the continuous-time bit waveforms that form w(t) are shown below x(t) and w(t), where $b_K$ represents the least significant bit of the continuous-time digital signal. Although FIG. 1 shows only three bits in the continuous-time digital signal, it is understood that the digitized continuous-time signal w(t) may include any number of bits. Other embodiments for representing an input analog signal with a quantized and digitized continuous-time signal may also be used. It is emphasized that what is different here from the prior art is that the bit waveforms are continuous-time ones. This is to be distinguished from the standard representation using discrete-time digital signals.

The continuous-time digital signal may be processed by a continuous-time ADC/DSP/DAC (Analog to Digital Converter/Digital Signal Processor/Digital to Analog Converter) that delays each bit of the continuous-time digital signal with one or more continuous-time delay lines. Since the bits of the continuous-time digital signal do not derive from periodic sampling, each bit remains a function of continuous-time. The DSP then multiplies the delayed bits by filtering coefficients, and forms a binary-weighted sum of the multiplication products. The resulting sum is a filtered version of the continuous-time digital signal, where the coefficients define the filter transfer function.

Figure 2:
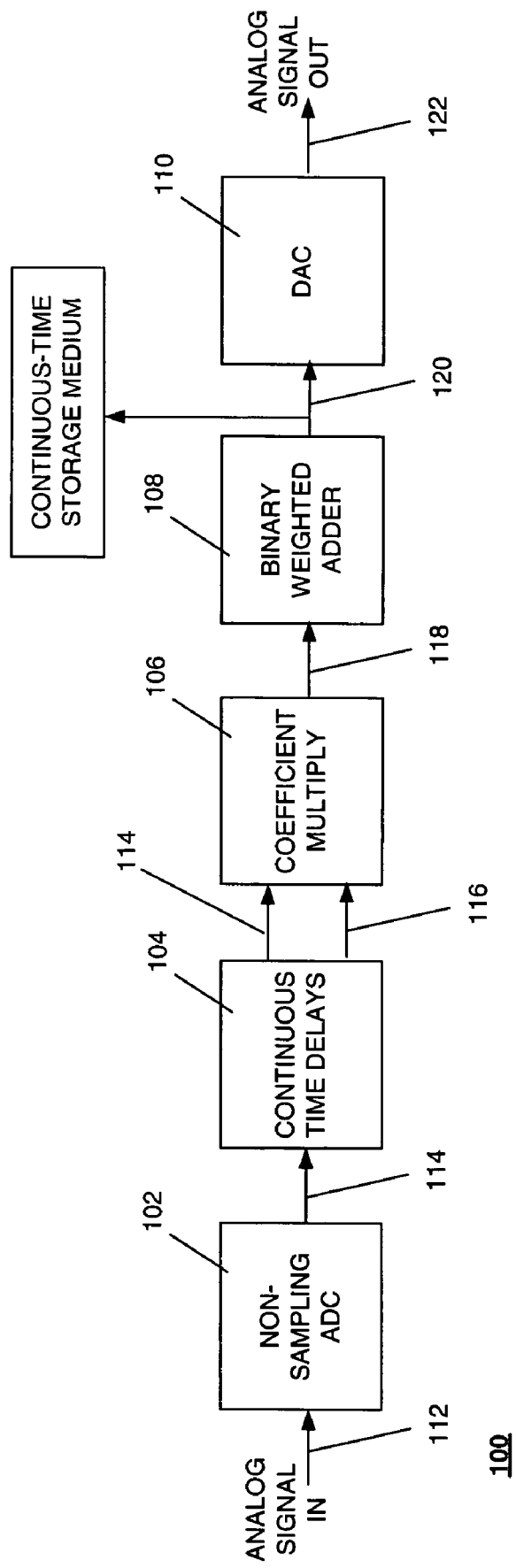
FIG. 2 is a block diagram of a continuous-time DSP.

FIG. 2 is a block diagram of a continuous-time ADC/DSP/DAC 100, including a non-sampling ADC 102, a continuous-time delay 104, a coefficient multiplier 106, a binary-weighted adder 108, and a DAC 110. In general, the ADC 102 receives an analog signal 112, and produces a sequence of discrete amplitude values 114 that is a continuous-time digital version of the analog signal. In one embodiment, the non-sampling ADC 102 quantizes the input analog signal 112 by comparing the input signal 112 to 16 discrete reference voltage levels, and setting the continuous-time digital signal 114 to a digital value that corresponds to a particular reference voltage level whenever the input level equals or exceeds that reference voltage level. Other types of non-sampling quantization known in the art may also be used.

Although shown in FIG. 2 as a single line, the continuous-time digital signal 114 is actually a digital word having a most significant bit, a least significant bit, and a word width, as described in more detail later.

The continuous-time delay 104 receives the continuous-time digital signal 114 from the ADC 102 and forwards a delayed version 116 of the continuous-time digital signal 114 along with the original continuous-time digital signal 114 to the coefficient multiplier 106.

The coefficient multiplier 106 multiplies the continuous-time digital signal 114 with one coefficient, and multiplies the delayed version 116 by another coefficient. These coefficients correspond to a transfer function, and are described in more detail below. The binary-weighted adder 108 combines the products 118 of the coefficients and the delayed/undelayed continuous-time digital signal as a weighted summation with respect to relative significance of the bits within those products 118.

The DAC 110 receives the weighted sum 120 and produces an analog output signal 122 therefrom.

Figure 3:
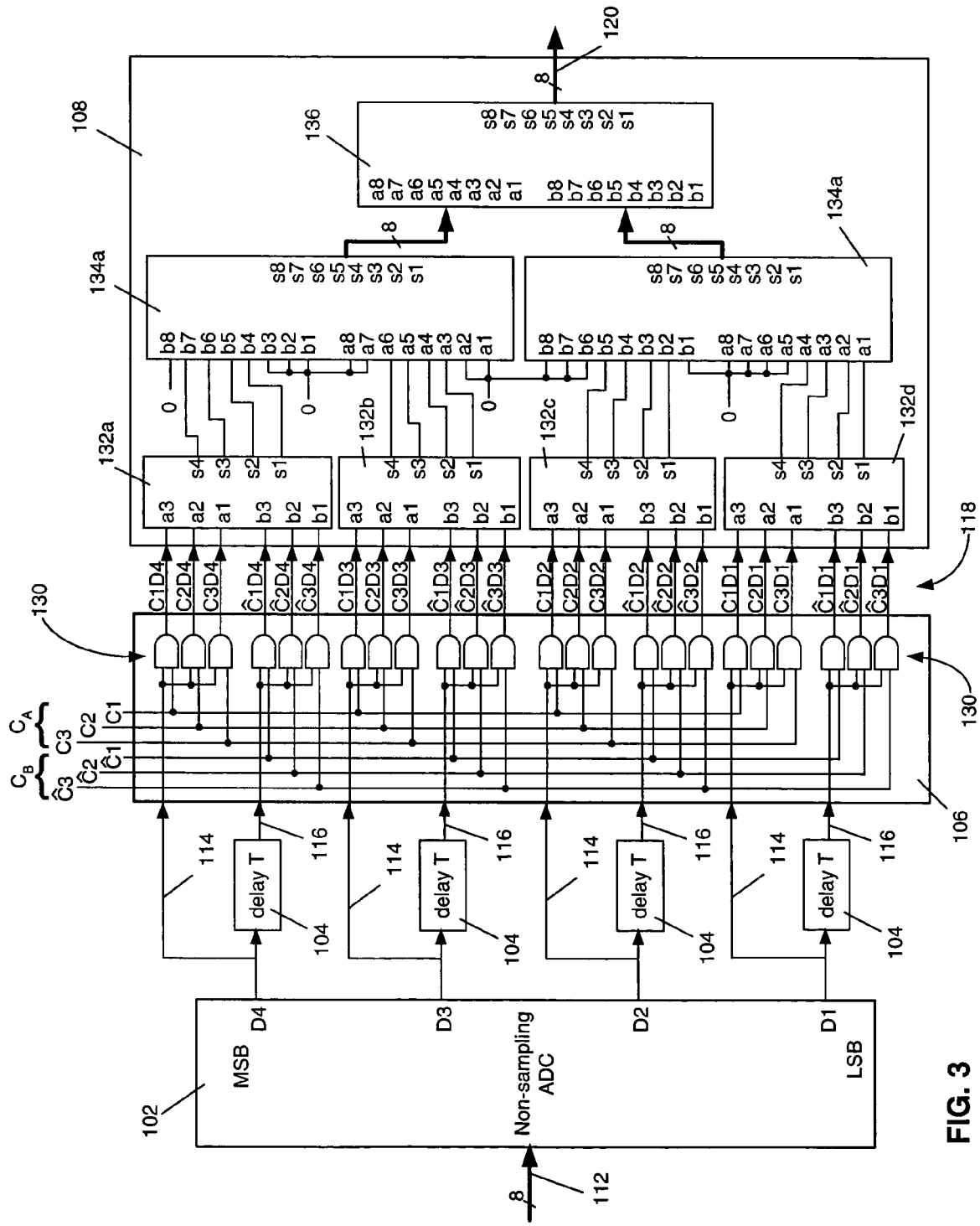
FIG. 3 is a more detailed view of the continuous-time DSP shown in FIG. 2.

FIG. 3 is a more detailed view of one possible implementation of the continuous-time DSP 100 shown in FIG. 2. The non-sampling ADC 102 quantizes the input analog signal 112 and produces a continuous-time digital signal 114 represented by a four-bit word, i.e., with 16-level quantization. Such an ADC can be implemented, for example, using a conventional "flash" architecture, in which an array of comparators compares the input signal to quantization level values. The outputs of the comparator can be fed into encoding logic, to produce the required bit values at the output of the ADC, without using any clock and latches, in order to ensure continuous-time operation. While the code used in the present example is a straight-forward one, it is to be understood that other well-known digital codes can be employed as well, with associated well-known advantages.

A continuous-time delay 104 delays each bit of the continuous-time digital signal 114 by a time period T. In this embodiment, each of the continuous-time delays 104 is a cascade of logic inverters, some or all coupled with load capacitances matched to their current drive capability to produce an appropriately slow switching time. Other continuous-time delay techniques known in the art may also be used for the delays 104. The delay such structures provide can be set to a precise value by making their current drive capability adjustable and locking their responses to an external clock, using standard techniques know in the art. Note that a clock used for this purpose does not affect the continuous-time nature of the signal flow through the DSP 100, and this is the only way the DSP 100 uses a clock. In other words, a clock used to set the delay lines to a precise delay value is not related to sampling in any way.

The coefficient multiplier 106 then multiplies the continuous-time digital signal 114 by coefficient $C_A$, and multiplies the delayed version 116 of the continuous-time digital signal 114 by coefficient $C_B$. In this embodiment, the "multiplication" is not true arithmetic multiplication, but is rather gating via AND gates 130. The coefficient $C_A$ includes three bits, $C_1$, $C_2$ and $C_3$. The coefficient $C_B$ includes three bits $\hat{C}_1$, $\hat{C}_2$ and $\hat{C}_3$. Thus, for each bit from the ADC 102, the multiplier 106 produces six bits of product data 118. For example, D4, the most significant bit (MSB) from the ADC 102 results in $C_1.D4$, $C_1.D4$, $C_1.D4$, $\hat{C}_1.D^2 4$, $\hat{C}_1.D^2 4$ and $\hat{C}_3.D^2 4$, where D4 is the un-delayed continuous-time digital signal 114, and $D^2 4$ is the delayed D4 116.

The binary-weighted adder 108 sums the resulting 24 bits of product data 118 via three summing stages. The first summing stage includes a set of four-bit adders 132a, 132b, 132c and 132d, each of which adds the delayed products to the un-delayed products for a particular bit to produce an intermediate sum. Note that although not shown in FIG. 3, the most significant input for each set of four-bit inputs to the adders 132 is held fixed at logic zero.

The second stage includes two eight-bit adders 134a and 134b, each of which adds the intermediate sum for two of the bit paths from the ADC 102. This second stage accounts for the decreasing bit significance from the most significant bit path to the least significant bit path by increasingly padding logic zeros in the higher significant bits of the adder inputs. This padding produces the "binary weighting" described herein. For the D4 bit path, adder 134a has a logic zero at input b8, and uses bits b4 through b7 to receive the intermediate sum bits. For the D3 bit path, adder 134a has logic zeros at inputs a7 and a8, and uses bits a3 through a6 to receive the intermediate sum bits. For the D2 path, adder 134b has logic zeros at inputs b6 through b8, and uses bits b2 through b5 to receive the intermediate sum bits. For the D1 path, adder 134b has logic zeros at input bits a5 through a8, and uses bits a1 through a4 to receive the intermediate sum bits. Note also that all unused lower bits on adders 134a and 134b are set to logic zero.

The third summing stage includes a single eight-bit adder 136 that adds the outputs from the adders 134a and 134b to produce the weighted sum 120. Although not shown in FIG. 3, the weighted sum 120 is subsequently converted to an analog signal via a digital to analog conversion process, i.e., as with the DAC 110 shown in FIG. 2. It is to be understood that the adder implementation is only used as an example. In high-speed applications, adder implementation should possibly take into account the nonzero propagation delays in the logic gates, and consider the delays of the various paths so that "isochronic forks" are implemented to ensure that bits to be added change their value at the same time.

The embodiment shown in FIG. 3 uses a four-bit digital signal and employs only two coefficients as an example for the sake of simplicity. In general, the concepts this embodiment represents can readily be extended to more bits and more coefficients. In addition, although for simplicity above we have presented the technique using for an example a non-recursive structure, the technique described can be implemented also in recursive form, where there is feedback such that the output of the DSP is processed in a manner similar to that above and is fed back to an internal point in the processor. Several other topologies commonly used in signal processors, as described, for example, in A. V. Oppenheim and R. W. Schafer, "Discrete-Time Signal Processing," Prentice-Hall, 1989 and elsewhere in the relevant technical literature, can also be used with this technique. Further, the specific components of this embodiment (i.e., the multiplier, the adder, the continuous-time delay, etc.) can all be implemented via other techniques known in the art, including optical ones. We will describe other more general embodiments later in this description, although no particular embodiment is mean to limit the concepts described herein.

The transfer function corresponding to each of N tap delays (where N in the example above is 2) is $e^{-sT}$, where s is the Laplace transform variable and T is the continuous-time delay between taps. Thus, in the case of integer n, each continuous-time bit is processed by a transfer function of the form:

$$H(e^{sT}) = \sum_{n=0}^{N} c_n e^{-nsT} \quad (1)$$

The continuous-time digital signal 114 is represented as a binary-weighted sum of individual bits, each of which is processed by transfer function (1). The binary-weighted sum formed by the adder 108 therefore corresponds to the continuous-time digital signal 114 processed by exactly the same transfer function (1). The transfer function of (1) corresponds to that of classical analog transmission-line filters, and is identical to the corresponding transfer function H(z) of a conventional digital filter.

Substituting jω for s in transfer function (1) shows that the frequency response is periodic, with period 2π/T. Since the continuous-time DSP 100 does not use sampling in any form, there is no aliasing in the filtered output, i.e., an input at a frequency ω produces an output at a frequency ω, regardless of the value of ω.

The continuous-time DSP described herein produces improved quantization noise characteristics as compared to sampling DSP systems because the quantization error of the continuous-time DSP contains only harmonics of the analog input signal. No aliasing of distortion components into the baseband occurs.

Due to the way the ADC 102 quantizes the analog signal, i.e., by generating quantization steps when the input signal crosses reference voltage levels, the step intervals in the quantization signal 114 are short when input analog signal 112 changes rapidly. Even shorter intervals can occur at the output of the binary-weighted adder 108 due to certain input combinations. These short step intervals, alone or combined with glitches caused by the combinatorial hardware, can cause momentary errors in the analog output signal 122. Such errors, however, are significantly different as compared to conventional DSP systems. Such deviations simply mean that the value of the quantization error in the output signal 122 changes somewhat, similar to the way noise and distortion in analog system vary depending on transient changes in system parameters. For the continuous-time DSP system described herein, the momentary errors in the analog output signal 122 are periodic when the input analog signal is periodic since there is no sampling. The noise spectra due to these errors occur at harmonic frequencies of the input, changing only the harmonic distortion of the output signal 122. Such momentary errors do not have a lasting effect on the output signal 122 because the DSP 100 does not use components with memory. The errors contribute little to the total mean square error of the output signal 122, precisely because they last only a short time and because much of the energy they contribute is out of band.

Although the embodiment described in FIGS. 2 and 3 is a hardware implementation, the concepts of that embodiment can also be implemented via software executing by a processor. These concepts can also be implemented in a recursive structure, in either hardware or software.

Figure 4:
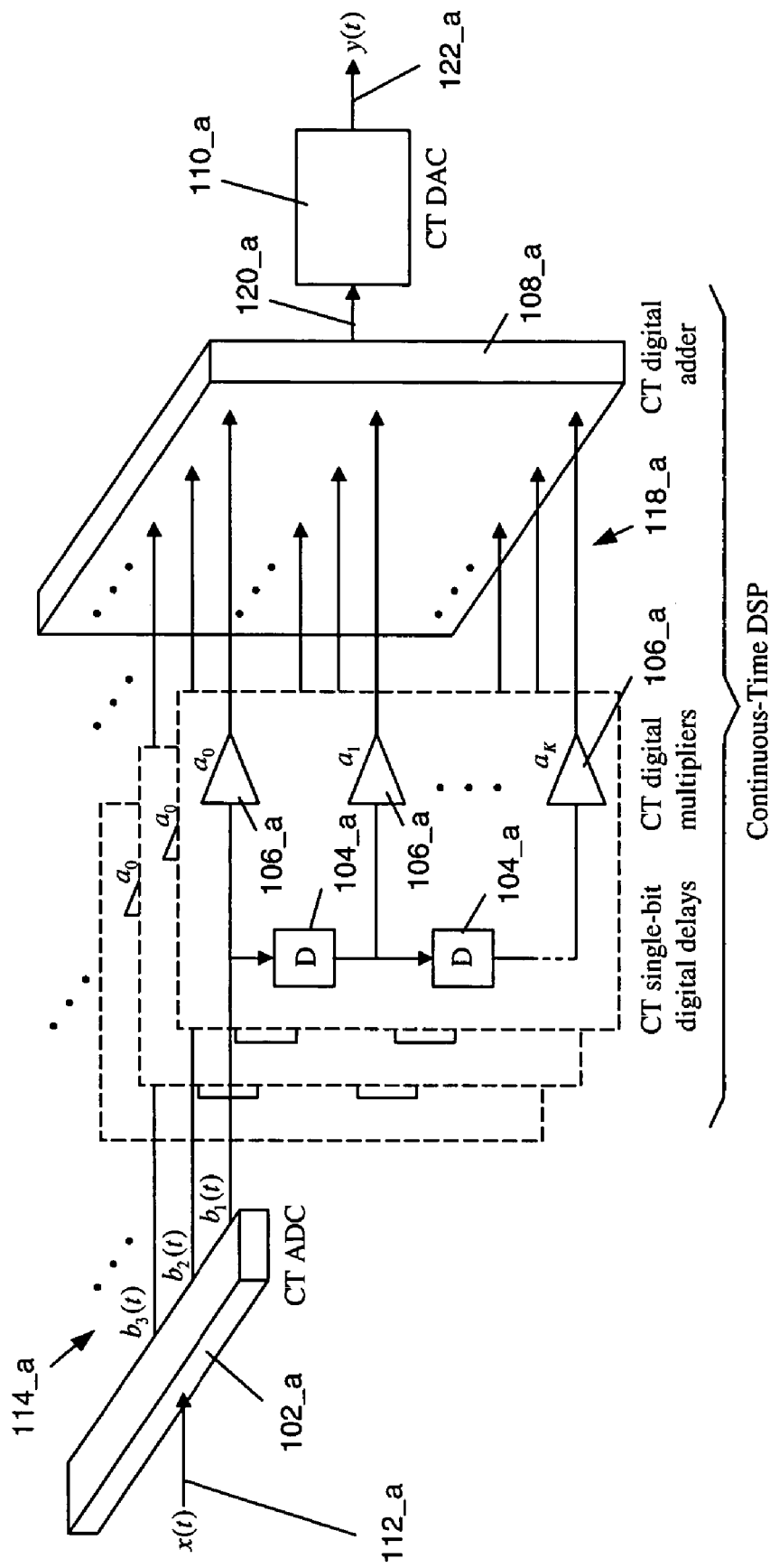
FIG. 4 shows a general representation of the continuous-time DSP embodiment of FIG. 2.

FIG. 4 shows a general representation of the continuous-time DSP described herein. In this figure, CT means continuous-time, D represents a continuous-time delay block, and $a_n$ represents a coefficient multiplication. FIG. 4 adds an "_a" suffix to the reference numbers from corresponding components in FIG. 2 to highlight the relationship between components in the two figures. As described herein, and as represented in FIG. 4 by broken lines and multiple dots (...), the continuous-time digital signal may include any number of bits, and the processor may use any number of delays and coefficients.

Other aspects, modifications, and embodiments are within the scope of the following claims.

What is claimed is:

1. An apparatus for generating and storing a continuous-time quantized and digitized signal from a continuous-time analog signal, comprising:
   one or more comparators for comparing the continuous-time analog signal to a set of reference signals, and for producing an intermediate signal that represents the reference signal to which the analog signal is nearest in amplitude;
   an encoder for producing a continuous-time digital word that represents the intermediate signal, wherein the continuous-time digital word is not related to a sampling reference, and the continuous-time digital word can change state at any point along a time continuum; and,
   a continuous-time storage medium for storing the continuous-time digital word.

2. A method of generating a continuous-time quantized and digitized signal from a continuous-time analog signal, comprising:
   comparing the continuous-time analog signal to a set of reference signals, and producing an intermediate signal that represents the reference signal to which the analog signal is nearest in amplitude;
   producing a continuous-time digital word that represents the intermediate signal, wherein the continuous-time digital word is not related to a sampling reference, and the continuous-time digital word can change state at any point along a time continuum; and,
   storing the continuous-time digital word on a continuous-time storage medium.

3. A method of generating a continuous-time quantized and digitized signal from a continuous-time analog signal, comprising:
   producing a sequence of discrete signals corresponding to the analog signal, wherein each discrete signal corresponds to the analog signal falling within one of a set of contiguous amplitude ranges;
   producing a sequence of continuous-time digital words, wherein each of the digital words represents a corresponding discrete signal from the sequence of discrete signals, and wherein the continuous-time digital word is not related to a sampling reference, and the continuous-time digital word can change state at any point along a time continuum; and,
   storing the digital word on a continuous-time storage medium.

4. A continuous-time digital signal processor, comprising:
   one or more continuous-time delay lines for producing one or more delayed versions of the continuous-time digital signal, each delayed version being delayed by a specified amount of time;
   a continuous-time digital multiplier for multiplying the continuous-time digital signal and each of the delayed versions by one or more associated digital coefficients, so as to produce a set of products; and,
   a non-clocked binary-weighted adder for adding the set of products, so as to produce a sum value corresponding to a transfer function defined by the associated coefficients and delays.

5. The continuous-time digital signal processor of claim 4, wherein at least one of the one or more continuous-time delay lines, the continuous-time digital multiplier, and the non-clocked binary-weighted adder are approximated with time-quantized components.

* * * * *